(12) United States Patent
Williams

(10) Patent No.: US 10,914,757 B2
(45) Date of Patent: Feb. 9, 2021

(54) CONNECTION MODULE

(71) Applicant: Teradyne, Inc., North Reading, MA (US)

(72) Inventor: Jonathan Hanes Williams, Andover, MA (US)

(73) Assignee: TERADYNE, INC., North Reading, MA (US)

( * ) Notice: Subject to any disclaimer, the term of this patent is extended or adjusted under 35 U.S.C. 154(b) by 55 days.

(21) Appl. No.: 16/270,264

(22) Filed: Feb. 7, 2019

(65) Prior Publication Data

US 2020/0256891 A1    Aug. 13, 2020

(51) Int. Cl.
| | |
|---|---|
| *G01R 1/073* | (2006.01) |
| *G01R 31/26* | (2020.01) |
| *G01R 31/28* | (2006.01) |
| *H01R 24/46* | (2011.01) |
| *H01R 24/50* | (2011.01) |
| *H05K 1/02* | (2006.01) |
| *H05K 1/11* | (2006.01) |

(Continued)

(52) U.S. Cl.
CPC .......... *G01R 1/07342* (2013.01); *H01P 3/003* (2013.01); *H01R 24/46* (2013.01); *H01R 24/50* (2013.01); *H05K 1/0219* (2013.01); *H05K 1/118* (2013.01); *H05K 1/147* (2013.01); *H05K 5/0047* (2013.01); *H05K 9/002* (2013.01); *H05K 9/0049* (2013.01)

(58) Field of Classification Search
CPC ........ G01R 1/073; G01R 31/26; G01R 31/28; G01R 31/2831; G01R 31/2889
See application file for complete search history.

(56) References Cited

U.S. PATENT DOCUMENTS

| | | |
|---|---|---|
| 2007/0040565 A1 | 2/2007 | Jayabalan et al. |
| 2008/0191726 A1* | 8/2008 | Ku .................... G01R 1/07342 324/755.07 |
| 2019/0349096 A1 | 11/2019 | Wadell et al. |

FOREIGN PATENT DOCUMENTS

| | | |
|---|---|---|
| CN | 101074970 A | 11/2007 |
| CN | 102074856 A | 5/2011 |

(Continued)

OTHER PUBLICATIONS

International Search Report for PCT/US2019/062969, 1 page (dated Mar. 13, 2020).

(Continued)

*Primary Examiner* — Neel D Shah
(74) *Attorney, Agent, or Firm* — Burns & Levinson LLP

(57) ABSTRACT

An example apparatus includes a connection module. The example connection module includes a connection interface and a connection matrix having a root transmission line to conduct signals to and from the connection interface. The connection matrix also includes branch transmission lines that are connectable electrically to the root transmission line to conduct the signals to and from the root transmission line. Each of the branch transmission lines is part of an electrical pathway between a device and the root transmission line. A housing encloses the connection matrix and enables access to the connection interface. The root transmission line and the branch transmission lines are each multi-conductor transmission lines that conduct the signals in transverse electromagnetic (TEM) mode.

21 Claims, 6 Drawing Sheets

(51) Int. Cl.
  *H05K 1/14* (2006.01)
  *H01P 3/00* (2006.01)
  *H05K 5/00* (2006.01)
  *H05K 9/00* (2006.01)

(56) References Cited

FOREIGN PATENT DOCUMENTS

| | | |
|---|---|---|
| CN | 103390848 A | 11/2013 |
| WO | 2007074765 A1 | 7/2007 |

OTHER PUBLICATIONS

Written Opinion for PCT/US2019/062969, 7 pages (dated Mar. 13, 2020).
Sage Millimeter, Inc., 8-Way Waveguide Power Divider, 50 to 66 GHz, Rev. 1.0, pp. 1-3 (2015).
Stiles, J., Transmission Lines and Waveguides, Chapter 3, 19 pages (Feb. 20, 2009).
SWP-50366308-15-E1, (8-Way Waveguide Power Divider, 50 to 66 GHz) Reference Guide. SAGE Millimeter, Inc. Torrance, CA. (Jan. 2018). V. 1.0, (pp. 1-3). 3 pages.
SCS-2734032516-KFKF-82, (8-Way Coaxial Power Splitter, 26.5 to 40 GHz) Reference Guide. SAGE Millimeter, Inc. Torrance, CA. (Jan. 2019). V. 1.0, (pp. 1-3). 3 pages.
SK8-2633036555-KFKF-AD1, (SP8T PIN Switch with TTL Driver, Absorptive, 26 to 30 GHz) Reference Guide. SAGE Millimeter, Inc. Torrance, CA. (Jan. 2018). V. 1.0, (pp. 1-3). 3 pages.

* cited by examiner

CONNECTION MODULE

TECHNICAL FIELD

This specification relates generally to connection modules configured to provide electrical connections between two systems or two devices.

BACKGROUND

A connection module includes hardware to connect to a device, such as a probe card. Systems, such as test equipment, may send electrical signals to, and receive electrical signals from, the device via the connection module.

SUMMARY

An example apparatus includes a connection module. The example connection module includes a connection interface and a connection matrix comprised of a root transmission line to conduct signals to and from the connection interface. The connection matrix also includes branch transmission lines that are connectable electrically to the root transmission line to conduct the signals to and from the root transmission line. Each of the branch transmission lines is part of an electrical pathway between a device and the root transmission line. A housing encloses the connection matrix and enables access to the connection interface. The root transmission line and the branch transmission lines are each multi-conductor transmission lines that conduct the signals in transverse electromagnetic (TEM) mode. The example apparatus may include one or more of the following features, either alone or in combination.

The connection matrix may be or include a thin-film circuit. The connection interface may include a coaxial connection interface. The connection matrix may include switches configured to open to break electrical connection along the electrical pathway and configured to close to cause electrical connection along the electrical pathway. The switches may be or include multiplexers.

The branch transmission lines may include a first branch transmission line and a second branch transmission line. The connection matrix may include a first switch that is configured to enable the root transmission line to connect electrically to either the first branch transmission line or the second branch transmission line.

The housing may be configured to act as a shield against electromagnetic interference to the connection matrix. The housing may include metal. The housing may include a first part and a second part that are connected using one or more fasteners or joining mechanisms, such as brazing, welding, epoxy, or conductive epoxy. The apparatus may include a module having a cross-sectional area that is 0.7 square inches or less.

The device may be or include a probe card for a test system. The core may include pins. At least some of the branch transmission lines may be configured for electrical connection to corresponding ones of the pins. The branch transmission lines may be configured to have a single signal line and multiple ground lines connected together.

The apparatus may include a second connection interface that is part of the electrical pathway between the device and the branch transmission lines. Some of the branch transmission lines terminate at the second connection interface. At the second connection interface, the branch transmission lines may include at least ground-signal-ground triplets. Different branch transmission lines may be configured at a pitch of 385 μm or less.

The connection matrix may include switches that open to break electrical connection along the electrical pathway and that close to cause electrical connection along the electrical pathway. Each switch may include an input port to receive a signal to open the switch or to close the switch.

An example system includes a probe card to connect to a device under test and a test instrument to connect to the probe card via an example connection module. Connection between the test instrument and the apparatus may be implemented by a connection to a connection interface. The example connection module includes the connection interface and a connection matrix comprised of a root transmission line to conduct signals to and from the connection interface. The connection matrix also includes branch transmission lines that are connectable electrically to the root transmission line to conduct the signals to and from the root transmission line. Each of the branch transmission lines is part of an electrical pathway between a device and the root transmission line. A housing encloses the connection matrix and enables access to the connection interface. The root transmission line and the branch transmission lines are each multi-conductor transmission lines that conduct the signals in transverse electromagnetic (TEM) mode. The system may include one or more of the following features, either alone or in combination.

The system may include one or more computing devices to orchestrate testing via the test instrument and to configure the connection matrix. The device under test may include a millimeter wave device. The probe card may include a core to contact the device under test and the apparatus may be for connecting electrically to the core.

Any two or more of the features described in this specification, including in this summary section, may be combined to form implementations not specifically described in this specification.

At least part of the connection modules and test systems described in this specification may be configured or controlled by executing, on one or more processing devices, instructions that are stored on one or more non-transitory machine-readable storage media. Examples of non-transitory machine-readable storage media include read-only memory, an optical disk drive, memory disk drive, and random access memory. At least part of the connection modules and test systems described in this specification may be configured or controlled using a computing system comprised of one or more processing devices and memory storing instructions that are executable by the one or more processing devices to perform various control operations.

The details of one or more implementations are set forth in the accompanying drawings and the following description. Other features and advantages will be apparent from the description and drawings, and from the claims.

DESCRIPTION OF THE DRAWINGS

Like reference numerals in different figures indicate like elements.

DETAILED DESCRIPTION

Figure 1:
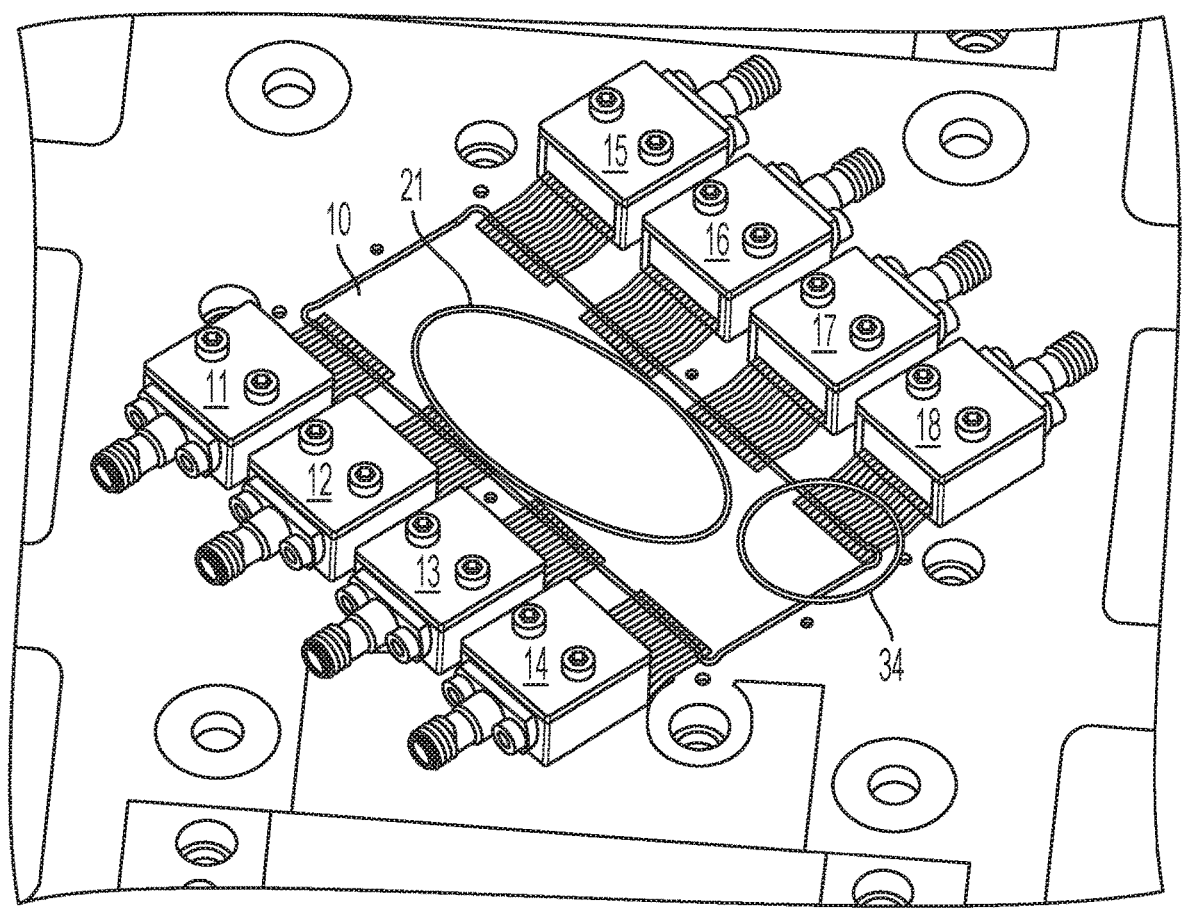
FIG. 1 is a perspective view of a probe card of a test system and eight example connection modules connected to the probe card.

Described herein are examples of a connection module configured to provide electrical connections between test equipment, such as automatic test equipment (ATE), and a device. An example of a such a device includes a probe card. An example probe card includes an interface between the test equipment and a device under test (DUT), such as a semiconductor wafer. In an example, the probe card provides an electrical connection between the test equipment and circuitry on the semiconductor wafer, thereby enabling testing of the circuitry at the wafer level. An example probe card includes a printed circuit board (PCB) and electrical contacts that contact electrically to corresponding electrical contacts on the DUT.

An example DUT that may benefit from having conductive modules on a probe card includes a millimeter-wave (mmwave) device. By one definition, the millimeter-wave spectrum includes the frequency band between 30 gigahertz (GHz) and 300 GHz. These frequencies can be used for high-speed wireless communications, for example. Transmitters, receivers, and transceiver devices, for example, may operate in the millimeter-wave spectrum and may be tested using a test system that includes a device, such as a probe card.

The connection module may be configured to provide multi-conductor—for example, two-conductor—transmission lines that conduct signals between the probe card and the test equipment in transverse electromagnetic (TEM) mode. In some examples, the pitch of electrical contacts on the DUT may be relatively fine—for example, on the order of hundreds of microns. In some examples, pitch includes the distance between parts—for example, centers—of adjacent electrical contacts. In this example, the pitch of interest includes the distance between adjacent electrical contacts on the probe card, which is equivalent to the pitch of adjacent electrical contacts on the DUT. The connection module is configured to provide electrical contacts at the pitch required by the probe card—for example, a pitch on the order of hundreds of microns.

In an example, the connection module includes a connection interface. An example connection interface includes a single coaxial interface; however, the connection module may include more than one interface and use other types of electrical interfaces. A connection matrix is configurable to transmit signals between the test equipment and electrical contacts on the probe card via the connection interface. For example, a signal may be input to the connection module through the connection interface, and the connection matrix may be configured to route that signal to a destination electrical contact on the probe card. In some implementations, the connection matrix includes a root transmission line to conduct signals to and from the connection interface and multiple branch transmission lines that are connectable electrically to the root transmission line to conduct the signals to and from the root transmission line. Each of the branch transmission lines is part of an electrical pathway between a device, such as the probe card, and the root transmission line/connection interface. Each branch transmission line may itself branch out to produce multiple branches that are part of the electrical pathway between the device and the root transmission line. Switches, such as multiplexers, may be controlled to configure the connection matrix to route the signals. A housing may enclose the connection matrix and enable external access to the connection interface. Examples of other types of switches that may be used include semiconductor devices, mechanical devices, and micro-electromechanical (MEMs) devices.

In some implementations, the root transmission line and the branch transmission lines are each multi-conductor transmission lines that conduct electrical signals in TEM mode. TEM mode is a mode of propagation for electrical signals in which electric and magnetic field lines associated with the signals are both restricted to directions normal—for example, in the transverse plane—to the direction of propagation of the signals. Example multi-conductor transmission lines include transmission lines that include a conductor and a return line. Examples of multi-conductor transmission lines include a coaxial cable, parallel lines such as a ladder line or twisted pair, and planar transmission lines such as stripline and microstrip conductors that operate in a quasi-TEM mode. Example multi-conductor transmission lines also include coplanar waveguides (CPWs), which include three conductors but in which two of the conductors are tied to ground, leaving a single signal conductor and a common ground connection. Example multi-conductor transmission lines also include grounded coplanar waveguides (GCPWs), which have five conductors but in which four of the conductors are tied to ground, leaving a single signal conductor and a common ground connection. Accordingly, a multi-conductor transmission line is not limited to transmission lines having only two wires.

In some implementations, all or part of the connection matrix is implemented using thin film lithography. Thin film lithography includes processes for creating patterns of conductive traces on a flat substrate. The conductive traces include the multi-conductor transmission lines described previously.

By using thin film lithography and multi-conductor transmission lines in the connection matrix, the connection module may be reduced in size relative to waveguide-based implementations that employ no conductors (such as plastic filament or glass fiber) or that employ a single conductor (such as a metal tube waveguide). Furthermore, by branching the transmission lines and controlling the switches, the connection matrix may enable connecting a single channel to multiple connections on a high-density device.

FIG. 1 shows an example implementation of a system that includes connection modules of the type described in the preceding paragraphs. In this example, each connection module is a hardware device that is configurable by a computer. Each connection module is configured for connection to a probe card 10. The probe card may be a single-site probe card or a multi-site probe card. In this regard, although a probe card is used as an example device here and throughout this specification, any appropriate device may be used with the connection module. In this example, there are eight connection modules 11, 12, 13, 14, 15, 16, 17, and 18—one set of four connection modules on each side of probe card 10. However, in other implementations, there may be fewer than eight connection modules or more than eight connection modules. For example, there may be two connection modules per probe card, three connection modules per probe card, four connection modules per probe card, five connection modules per probe card, six connection modules per probe card, seven connection modules per probe card, nine connection modules per probe card, ten connection modules per probe card, and so forth.

Figure 2:
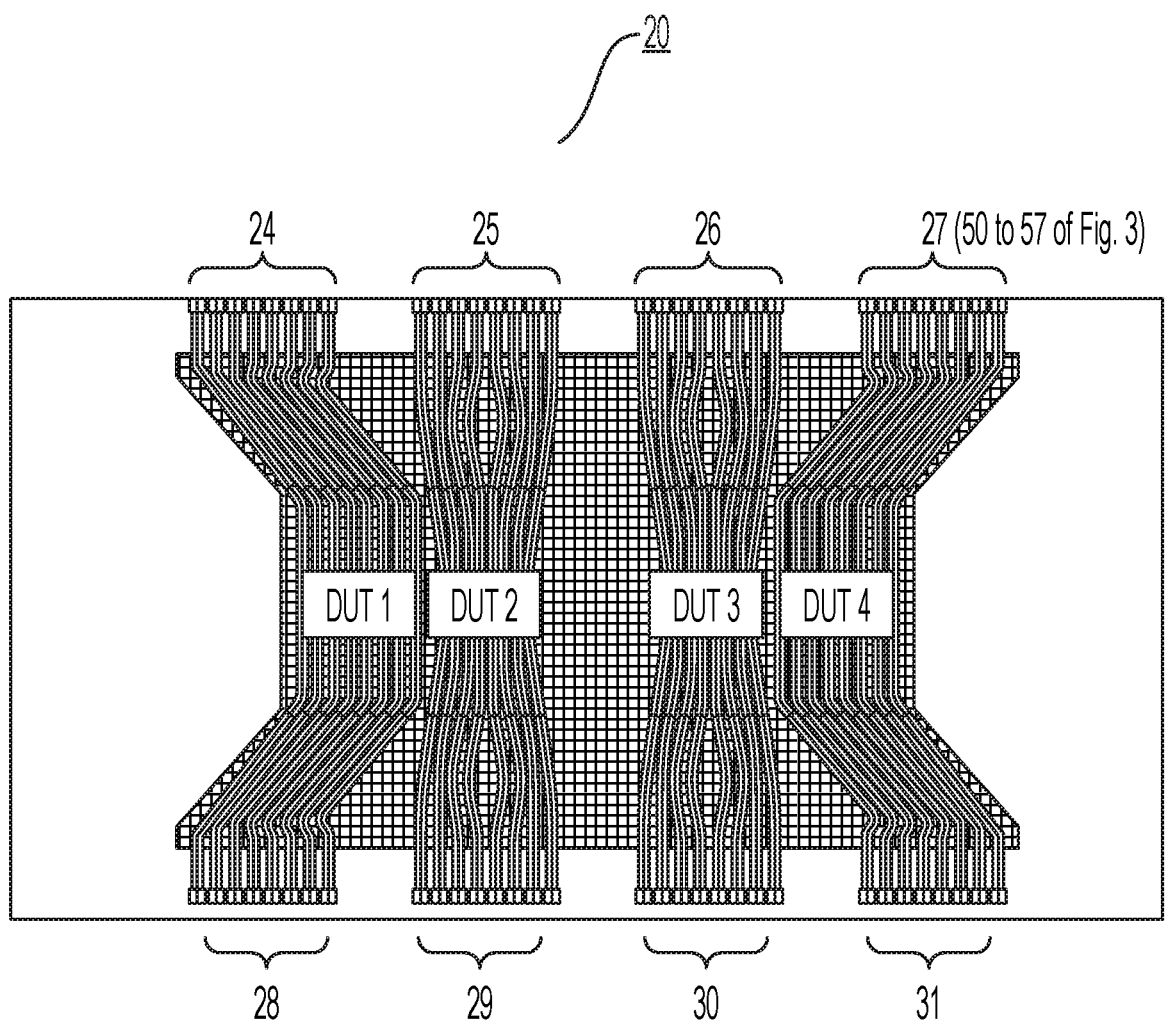
FIG. 2 is a top view of example conductive traces on a core of the probe card.

FIG. 2 shows sets of conductive traces 20 on a core of probe card 10 (the core being identified by oval 21 of FIG. 1), which lead from devices under test (DUTs—DUT 1, DUT 2, DUT 3, and DUT 4 in FIG. 2) to corresponding connection modules. For example, conductive traces 24 lead to connection module 15; conductive traces 25 lead to connection module 16; conductive traces 26 lead to connection module 17; conductive traces 27 (50 to 57 of FIG. 3) lead to connection module 18; conductive traces 28 lead to connection module 11; conductive traces 29 lead to connection module 12; conductive traces 30 lead to connection module 13; and conductive traces 31 lead to connection module 14. In this example, each connection module includes multiple multi-conductor transmission line electrical interfaces to corresponding conductive traces on the probe card. For example, connection module 18 includes eight multi-conductor transmission line electrical interfaces to eight corresponding conductive traces on a connector at the location of oval 34 in FIG. 1. Every other connection module may have the same configuration as connection module 18.

Figure 3:
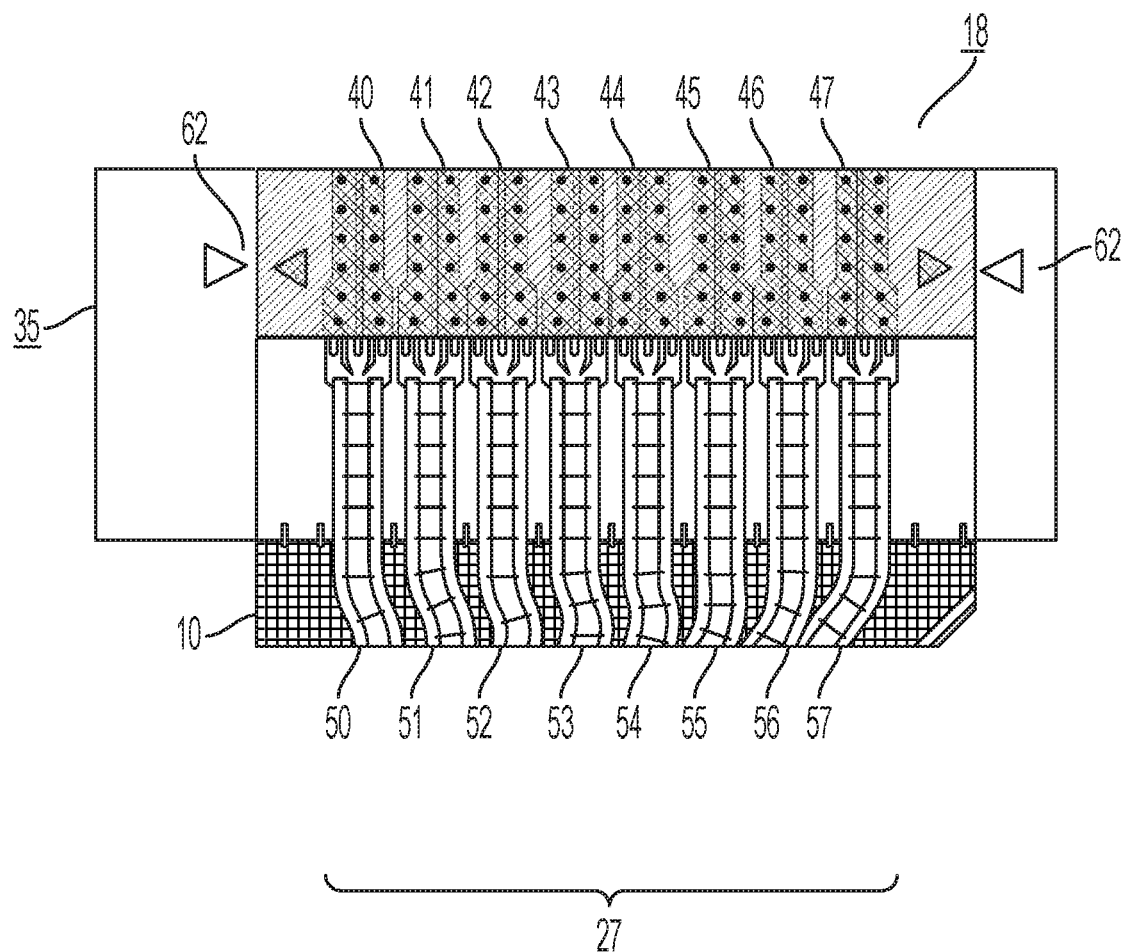
FIG. 3 is a cut-away side view of multi-conductor transmission lines on an example connection module connecting electrically to conductive traces on the probe card.

FIG. 3 shows an example implementation of a connection interface 35 between eight multi-conductor transmission lines 40, 41, 42, 43, 44, 45, 46, and 47 on example connection module 18, and corresponding conductive traces 50, 51, 52, 53, 54, 55, 56, and 57 on probe card 10. In this example, connection interface 35 includes an electrical interface for each multi-conductor transmission line to a corresponding pin electrically connected to a conductive trace on the probe card. In this example, connection interface 35 includes alignment features 62. Electrical interfaces for the multi-conductor transmission lines on the connection module align to a corresponding connector on the probe card having the alignment features 62. Once aligned, a connection is made to a corresponding connector on the probe card that includes the pins leading to the conductive traces on the probe card.

Figure 4:
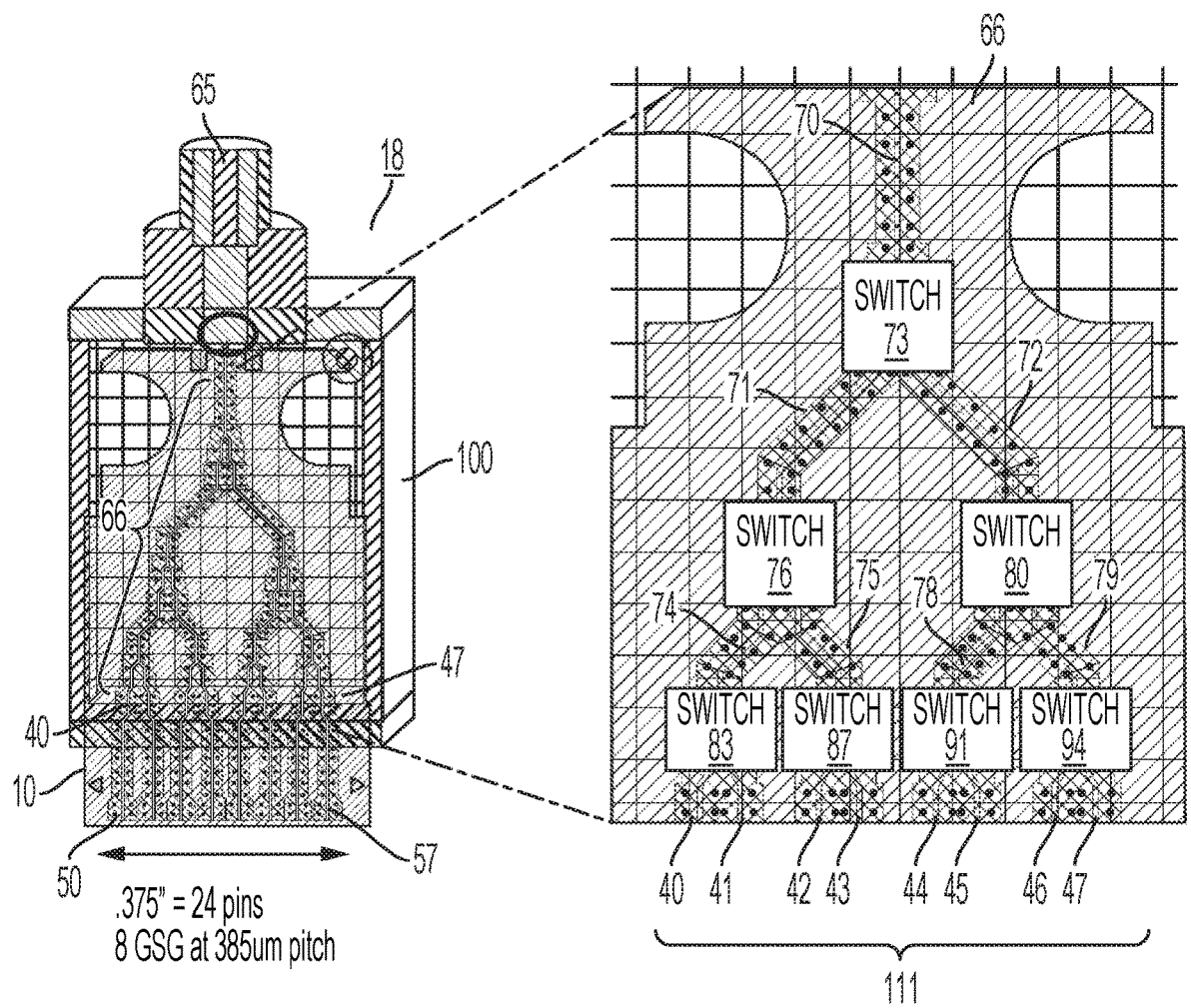
FIG. 4 is a cut-away side view of multi-conductor transmission lines on the connection module connecting electrically to conductive traces on the probe card, and an enlarged cut-away side view of a connection matrix contained in the connection module.

FIG. 4 shows components of example connection module 18. Connection module 10 includes a connection interface 65. The connection interface allows other components of test equipment, such as a test instrument, to connect to the probe card via the connection module. In this regard, in some implementations, test instruments are in a test head of the test equipment. Each test instrument may be housed in a separate slot in the test head. In some implementations, the test instruments are modular. For example, one test instrument may be replaced with a different test instrument that performs a different function or the same function, without replacing other test instruments. Each test instrument may be configured to output test signals to test a DUT, and to receive signals from the DUT. The signals may be digital, analog, wireless, or wired, for example. The signals received may include response signals that are based on the test signals, signals that originate from the DUT that are not prompted by (e.g., that are not in response to) test signals, or both types of these signals.

Connection interface 65 includes a multi-conductor transmission line interface, such as a coaxial cable interface. Other types of multi-conductor transmission line interfaces may be used instead of a coaxial or multi-conductor transmission line interface. Connection module 18 also includes connection matrix 66, which is also shown enlarged in the figure. As explained above, connection matrix 66 is configurable to transmit signals between the test equipment and electrical contacts on the probe card via the connection interface. Connection matrix 66 includes a root transmission line 70 to conduct signals to and from connection interface 65 and multiple branch transmission lines that fan-out from, and are connectable electrically to, the root transmission line to conduct the signals to and from the root transmission line. Each of the branch transmission lines is part of an electrical pathway between probe card 10 and root transmission line 70. In this example implementation, the root transmission line and each of the branch transmission lines is implemented using a multi-conductor transmission line. Switches, such as multiplexers, may be controlled to configure the connection matrix to route the signals.

In this example, connection matrix 66 includes a first branch transmission line 71, a second branch transmission line 72, and a first switch 73 that is configured to enable root conductor 70 to connect electrically to either first branch transmission line 71 or second branch transmission line 72. In this example, connection matrix 66 includes a third branch transmission line 74, a fourth branch transmission line 75, and a second switch 76 that is configured to enable first branch transmission line 71 to connect electrically to either third branch transmission line 74 or fourth branch transmission line 75. In this example, connection matrix 66 includes a fifth branch transmission line 78, a sixth branch transmission line 79, and a third switch 80 that is configured to enable second branch transmission line 72 to connect electrically to either fifth branch transmission line 78 or the sixth branch transmission line 79.

Referring also to FIG. 4, in this example, connection matrix 66 includes branch transmission lines 40 and 41 and switch 83 to connect either of branch transmission lines 40 or 41 to third branch transmission line 74. In this example, connection matrix 66 also includes branch transmission lines 42 and 43 and switch 87 to connect either of branch transmission lines 42 or 43 to fourth branch transmission line 75. In this example, connection matrix 66 also includes branch transmission lines 44 and 45 and switch 91 to connect either of branch transmission lines 44 or 45 to fifth branch transmission line 78. In this example, connection matrix 66 also includes branch transmission lines 46 and 47 and switch 94 to connect either of branch transmission lines 46 or 47 to sixth branch transmission line 79. In some implementations, there may be additional or fewer branch transmission lines than those implemented in connection module 18. In some implementations, each of connection modules 11 to 17 have the same configuration and functionality as connection module 18. As was the case in FIG. 3, branch transmission lines 40 to 47 terminate at, and electrically connect to, corresponding pins on probe card 10 that themselves electrically connect to corresponding conductive traces 50 to 57 on probe card 10.

As explained above, in some implementations, the root transmission line and the branch transmission lines are each multi-conductor transmission lines that conduct electrical signals in TEM mode. As also explained above, an example multi-conductor transmission line also includes a CPW having three conductors. In an example CPW, individual conductors are configured in a ground-signal-ground (GSG) triplet. This GSG triplet corresponds to a port or pin of the probe card. To create a multi-conductor transmission line from the GSG triplet, the two ground lines are electrically connected together, leaving a single signal line and a common ground connection. In some implementations, adjacent GSG triplets are configured at a pitch of 385 µm or less. In an example GCPW, individual conductors are configured in a GSG triplet but also include one or more additional ground planes, for example two ground planes. The resulting quintet corresponds to a port or pin of the probe card. To create a multi-conductor transmission line from a GCPW quintet, the four ground lines are electrically connected together, leaving a single signal line and a common ground connection. In some implementations, adjacent GCPW quintets are configured at a pitch of 385 µm or less.

The switches may be implemented using any appropriate switching technology, such as multiplexers, transistors, or arrangements of logic gates. Each switch may include a port to receive a signal to control its configuration, for example, whether the switch is open or closed. A computing system, which may be part of the test equipment, is configured—for example, programmed—to control the switches to route signals to selected conductive traces on the probe card. For example, the computing system may be configured to control switches 73, 76, and 83 and to control the remaining switches to open to route a signal to branch transmission line 40 and thus to conductive trace 50. In another example, the computing system may be configured to control switches 73, 80, and 94 and to control the remaining switches to open to route a signal to branch transmission line 47 and thus to conductive trace 57. The computing system is also configured to control and to orchestrate testing operations to be performed on the DUT while controlling the switching configuration.

All or part of connection matrix 66 may be or include a thin film circuit implemented using thin film lithography. As explained previously, thin film lithography includes processes for creating patterns of conductive traces on a flat substrate. The conductive traces include the multi-conductor transmission lines that implement the root conductor and each of the branch transmission lines. In some examples, thin film lithography is a wafer fabrication process that vacuum-deposits conductive films on a flat substrate. Examples of flat substrates include, but are not limited to, glass, quartz, and ceramic, all of which can be polished to provide flat imaging plane upon which deposition may occur. In some implementations, the substrate can be added on top of the conductive trace, as is the case in polyimide substrates. Additional metallization may also be deposited in a thin film process to implement coaxial transmission lines having an air dielectric. In some implementations, the connection matrix may be implemented using a flexible circuit.

Figure 5:
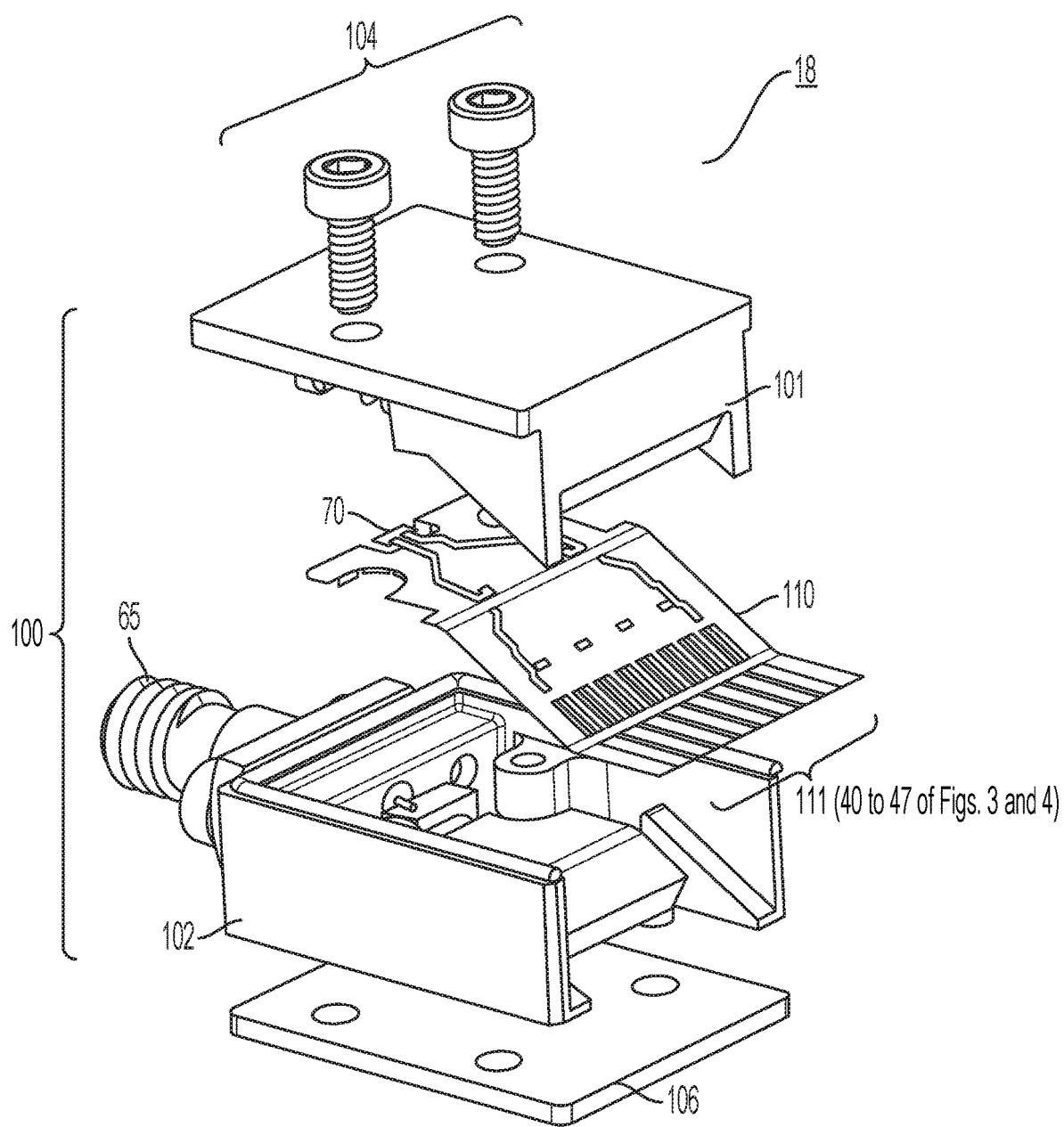
FIG. 5 is an exploded view of an example connection module.

Referring to FIGS. 4 and 5, example connection module 18 also includes a housing 100 to enclose connection matrix 66 and to enable access to connection interface 65. The housing may be configured to act as a shield against electromagnetic interference to the connection matrix. In some implementations, the shielding provides electromagnetic isolation between circuits inside the connection module and circuitry on the probe card. For example, the housing may be or include metal, such as copper or nickel. The metal may coat another non-conductive material such as ceramic or plastic. For example, the metal may be in the form of ink or foam. FIG. 5 shows an example of housing 100 comprised of a first part 101 and a second part 102 that are connected using one or more fasteners—in this example, screws 104. The housing includes connection interface 65—in this example, a coaxial interface, along with an electromagnetically-shielded substrate 106 on which the housing is mounted. In the example of FIG. 5, the connection matrix 66 is implemented as a flexible circuit 110. Shown in FIG. 5 are root conductor 70 electrically connected to connection interface 65 and the various branch transmission lines 111—for example, branch transmission lines 40 to 47 of FIGS. 3 and 4—that lead to electrical connections on the probe card.

As explained previously, by using thin film lithography and multi-conductor transmission lines in the connection matrix, the connection module can be reduced in size. For example, in some implementations, the connection module has a cross-sectional area that is 0.7 square inches (or 4.51 square centimeters ($cm^2$)) or less. In some implementations, the connection module has a cross-sectional area that is 1 square inch (6.45 $cm^2$) or less, 0.9 square inches (5.80 $cm^2$) or less, 0.8 square inches (5.16 $cm^2$) or less, 0.6 square inches (3.87 $cm^2$) or less, 0.5 square inches (3.22 $cm^2$) or less, 0.4 square inches (2.58 $cm^2$) or less, 0.3 square inches (1.94 $cm^2$) or less, and so forth. In some implementations, adjacent electrical connections to the probe card in the connection module—for example, adjacent GSG triplets or GGSGG quintets—are configured at a pitch of 1000 µm or less, 900 µm or less, 800 µm or less, 700 µm or less, 600 µm or less, 500 µm or less, 400 µm or less—for example, 385 µm, 300 µm or less, 200 µm or less, 100 µm or less, and so forth.

Figure 6:
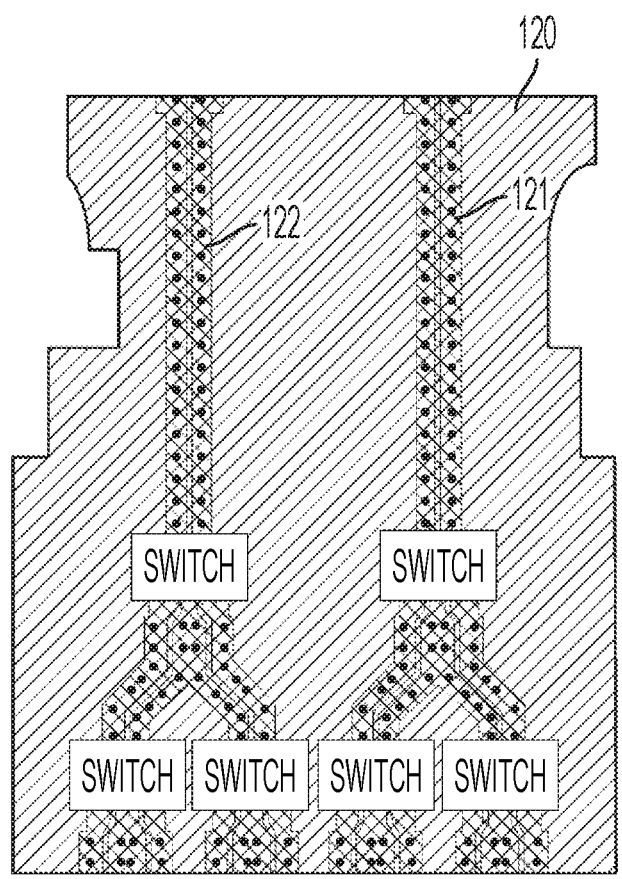
FIG. 6 is a cut-away side view of components of an example connection module having two connection interfaces.

FIG. 6 shows components of an example connection module 120 containing two connectors and, therefore two root transmission lines 121, 122. The remaining structure and operation of connection module 120 and the switches contained therein is substantially or completely like the operation of the connection module described with respect to FIGS. 1 to 5.

The connection modules have been described for use with mmwave DUTs. However, the connection modules are not limited to mmwave devices. For example, the connection interface may be used with DUTs that operates at DC (direct current) frequencies to 80 GHz.

In some implementations, the connection module may be configured to terminate one or more of the branch transmission lines within the module. For example, one or more branch transmissions line may be terminated that lead to or are associated with one or more calibration loads, one or more power detectors, or one or more semiconductor devices having signal processing functions.

All or part of the connection modules and test systems described in this specification and their various modifications may be configured or controlled at least in part by one or more computers using one or more computer programs tangibly embodied in one or more information carriers, such as in one or more non-transitory machine-readable storage media. A computer program can be written in any form of programming language, including compiled or interpreted languages, and it can be deployed in any form, including as a stand-alone program or as a module, part, subroutine, or other unit suitable for use in a computing environment. A computer program can be deployed to be executed on one computer or on multiple computers at one site or distributed across multiple sites and interconnected by a network.

Actions associated with configuring or controlling the connection modules and test systems can be performed by one or more programmable processors executing one or more computer programs to control all or some of the well formation operations described previously. All or part of the connection modules and test systems can be configured or controlled by special purpose logic circuitry, such as, an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks. Non-transitory machine-readable storage media suitable for embodying computer program instructions and data include all forms of non-volatile storage area, including by way of example, semiconductor storage area devices, such as EPROM (erasable programmable read-only memory), EEPROM (electrically erasable programmable read-only memory), and flash storage area devices; magnetic disks, such as internal hard disks or removable disks; magneto-optical disks; and CD-ROM (compact disc read-only memory) and DVD-ROM (digital versatile disc read-only memory).

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. An apparatus comprising:
   a connection interface;
   a connection matrix comprised of a root transmission line to conduct signals to and from the connection interface, the connection matrix further comprising branch transmission lines that are connectable electrically to the root transmission line to conduct the signals to and from the root transmission line, each of the branch transmission lines being a connectable part of an electrical pathway between a device and the root transmission line; and
   a housing to enclose the connection matrix and to enable access to the connection interface;
   wherein the root transmission line and the branch transmission lines are each multi-conductor transmission lines that conduct the signals in transverse electromagnetic (TEM) mode;
   wherein the branch transmission lines comprise a first branch transmission line and a second branch transmission line; and
   wherein the connection matrix comprises a first switch that is configured to enable the root transmission line to connect electrically to either the first branch transmission line or the second branch transmission line.

2. The apparatus of claim 1, wherein the device comprises a probe card for a test system.

3. The apparatus of claim 1, wherein the connection interface comprises a coaxial connection interface.

4. The apparatus of claim 1, wherein the connection matrix comprises switches configured to open in order to break electrical connections along electrical pathways between the device and the root transmission line and configured to close to cause electrical connections along the electrical pathways, where the switches include the first switch and the electrical pathways include the branch transmission lines.

5. The apparatus of claim 4, wherein the switches comprise multiplexers, semiconductor devices, mechanical switches, micro-electromechanical devices, or combinations of two or more of multiplexers, semiconductor devices, mechanical switches, or micro-electromechanical devices.

6. An apparatus comprising:
   a connection interface;
   a connection matrix comprised of a root transmission line to conduct signals to and from the connection interface, the connection matrix further comprising branch transmission lines that are connectable electrically to the root transmission line to conduct the signals to and from the root transmission line, each of the branch transmission lines being a connectable part of an electrical pathway between a device and the root transmission line;
   a second connection interface that is part of the electrical pathway between the device and the branch transmission lines; and
   a housing to enclose the connection matrix and to enable access to the connection interface;
   wherein the root transmission line and the branch transmission lines are each multi-conductor transmission lines that conduct the signals in transverse electromagnetic (TEM) mode; and
   wherein some of the branch transmission lines terminate at the second connection interface.

7. The apparatus of claim 4, wherein the switches are configured to conduct between a first number of root transmission lines a second number of branch transmission lines.

8. The apparatus of claim 1, wherein the housing is configured to act as a shield against electromagnetic interference to the connection matrix.

9. The apparatus of claim 1, wherein the housing comprises metal.

10. The apparatus of claim 1, wherein the housing comprises a first part and a second part that are connected using one or more fasteners, brazing, welding, epoxy, conductive epoxy, or a combination of two or more of fasteners, brazing, welding, epoxy, or conductive epoxy.

11. The apparatus of claim 1, wherein the apparatus is a module having a cross-sectional area that is 0.7 square inches or less.

12. The apparatus of claim 1, further comprising:
   a second connection interface that is part of the electrical pathways between the device and the branch transmission lines.

13. The apparatus of claim 1, wherein the connection matrix comprises a thin-film circuit.

14. An apparatus comprising:
   a connection interface;
   a connection matrix comprised of a root transmission line to conduct signals to and from the connection interface, the connection matrix further comprising branch transmission lines that are connectable electrically to the root transmission line to conduct the signals to and from the root transmission line, each of the branch transmission lines being a connectable part of an electrical pathway between a device and the root transmission line; and
   a housing to enclose the connection matrix and to enable access to the connection interface;

wherein the root transmission line and the branch transmission lines are each multi-conductor transmission lines that conduct the signals in transverse electromagnetic (TEM) mode;

wherein the device comprises a core of a probe card; and wherein the core comprises pins, at least some of the branch transmission lines being configured for electrical connection to corresponding ones of the pins.

15. The apparatus of claim 14, wherein the branch transmission lines are configured to have a single signal line and multiple ground lines connected together.

16. The apparatus of claim 6 wherein the connection matrix comprises switches including a first switch that open in order to break electrical connections along electrical pathways between the device and the root transmission line and that close to cause electrical connections along the electrical pathways; and wherein each switch comprises an input port to receive a signal to open the switch or to close the switch.

17. The apparatus of claim 6, wherein, at the second connection interface, the branch transmission lines comprises at least ground-signal-ground triplets;

wherein different branch transmission lines are configured at a pitch of 385 µm or less; and wherein the second connection interface is part of multiple electrical pathways, including the electrical pathway, between the device and the branch transmission lines.

18. A system comprising:

a probe card comprising the device to connect to a device under test; and a test instrument to connect to the probe card via the apparatus of claim 6, where connection between the test instrument and the apparatus is implemented by a connection to the connection interface.

19. The system of claim 18, further comprising:

one or more computing devices to orchestrate testing via the test instrument and to configure the connection matrix.

20. The system of claim 18, wherein the device under test comprises a millimeter wave device.

21. The system of claim 18, wherein the probe card comprises a core to contact the device under test, the apparatus for connecting electrically to the core.

* * * * *